(12) United States Patent
Hidaka et al.

(10) Patent No.: US 6,937,118 B2
(45) Date of Patent: Aug. 30, 2005

(54) HIGH-FREQUENCY CIRCUIT DEVICE, RESONATOR, FILTER, DUPLEXER, AND HIGH-FREQUENCY CIRCUIT APPARATUS

(75) Inventors: Seiji Hidaka, Nagaokakyo (JP); Shin Abe, Muko (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 47 days.

(21) Appl. No.: 10/402,929

(22) Filed: Apr. 1, 2003

(65) Prior Publication Data

US 2003/0227081 A1 Dec. 11, 2003

(30) Foreign Application Priority Data

Apr. 1, 2002 (JP) ........................................ 2002-099326

(51) Int. Cl.[7] ................................................. H01P 7/00
(52) U.S. Cl. .................... 333/219; 333/219.1; 333/202; 333/203
(58) Field of Search ............................. 333/219, 219.1, 333/202, 203

(56) References Cited

U.S. PATENT DOCUMENTS

| | | | | |
|---|---|---|---|---|
| 4,879,533 A | * | 11/1989 | de Muro et al. ............ 333/206 |
| 5,621,365 A | * | 4/1997 | Yamazaki et al. ........... 333/204 |
| 6,016,091 A | * | 1/2000 | Hidaka et al. ............... 333/202 |
| 6,211,755 B1 | * | 4/2001 | Kubota et al. ............ 333/219.1 |
| 6,281,763 B1 | * | 8/2001 | Ishikawa et al. ............. 333/134 |
| 6,388,544 B1 | * | 5/2002 | Ella ........................... 333/189 |

* cited by examiner

*Primary Examiner*—Robert Pascal
*Assistant Examiner*—Kimberly Glenn
(74) *Attorney, Agent, or Firm*—Dickstein, Shapiro, Morin & Oshinsky, LLP.

(57) ABSTRACT

A high-frequency circuit device serving as a resonator includes a substrate and an electrode film which is formed on the surface of the substrate and which includes a conductive film and a dielectric film. The conductive film is formed around the substrate such that both ends of the conductive film overlap each other when viewed in a predetermined cross-section of the substrate, and the dielectric film is inserted between both ends of the conductive film. Accordingly, a self-capacitance portion is formed at the overlapped portion of the conductive film, electric-field energy is accumulated therein, and magnetic-field energy is accumulated inside the substrate. With this step impedance structure, the entire high-frequency circuit device can be miniaturized.

10 Claims, 21 Drawing Sheets

A-A CROSS-SECTION

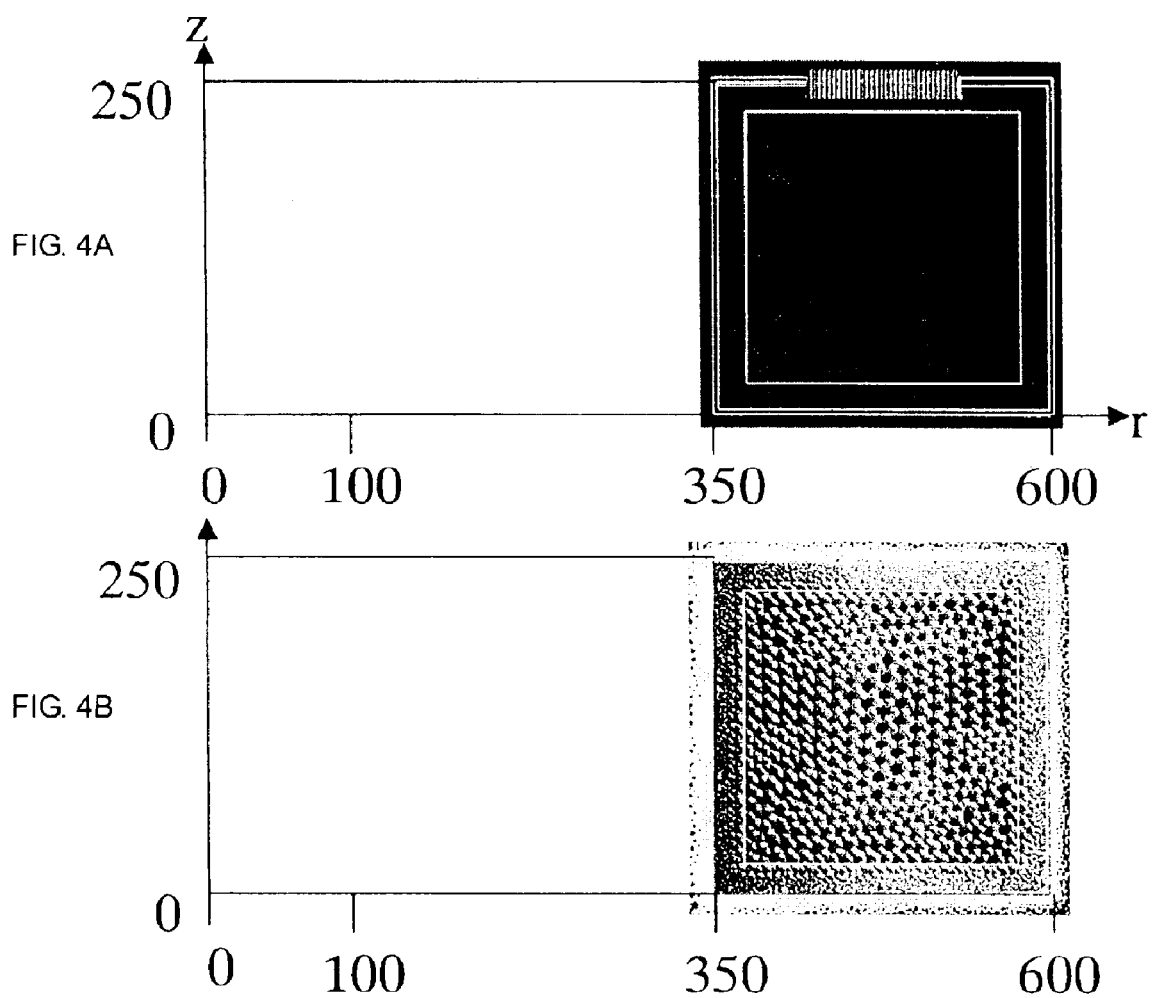

A-A CROSS-SECTION

A-A CROSS-SECTION

FIG. 9
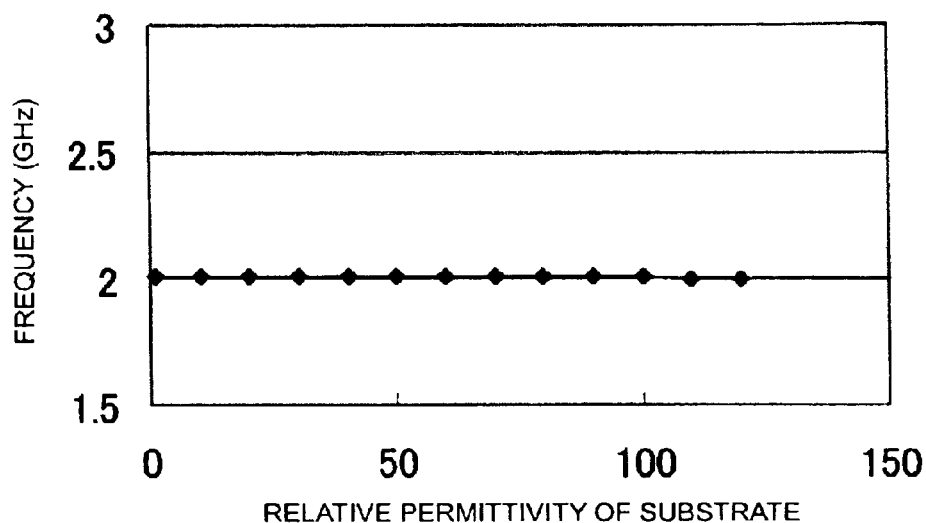
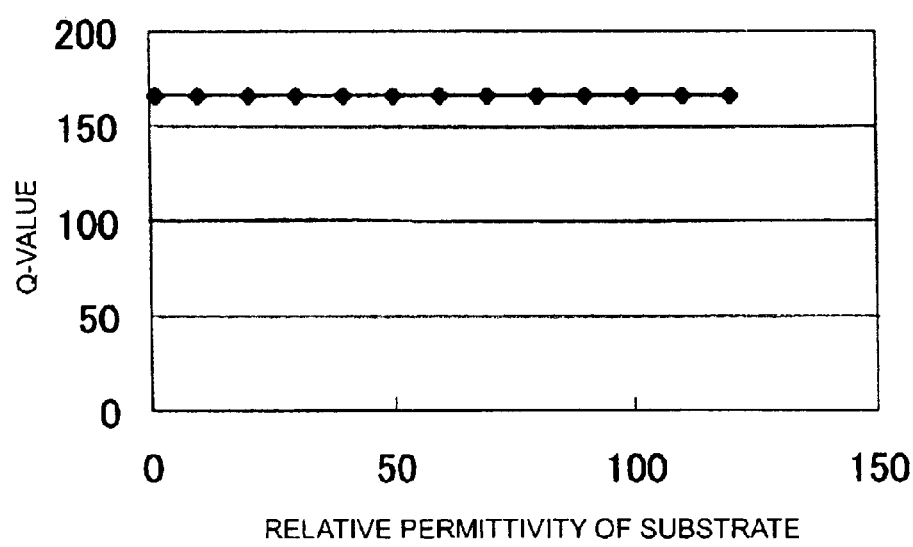

FIG. 10
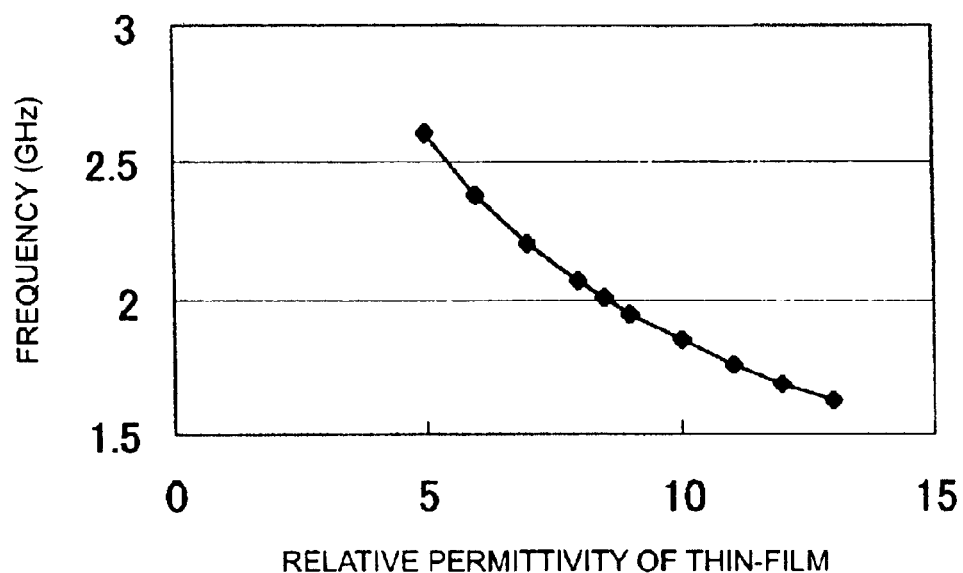
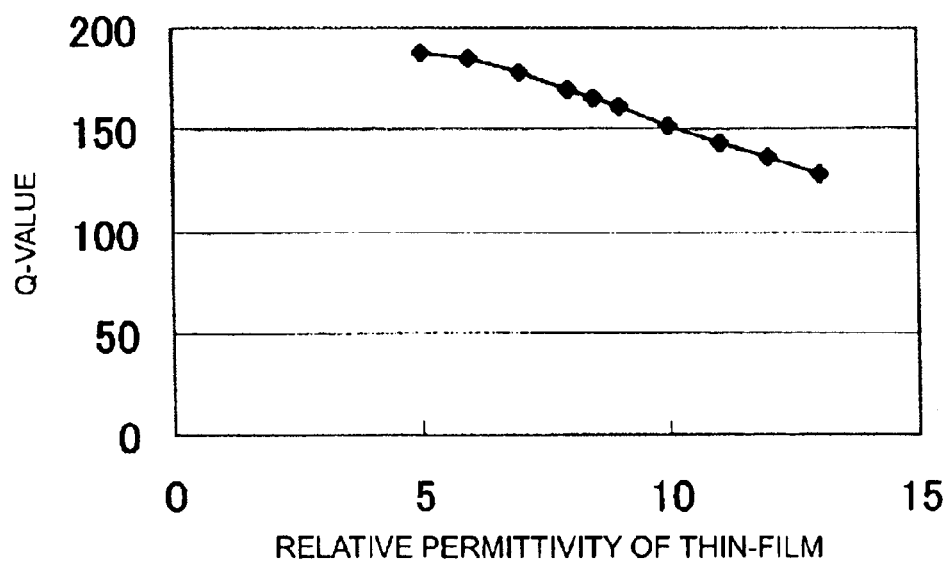

250

250

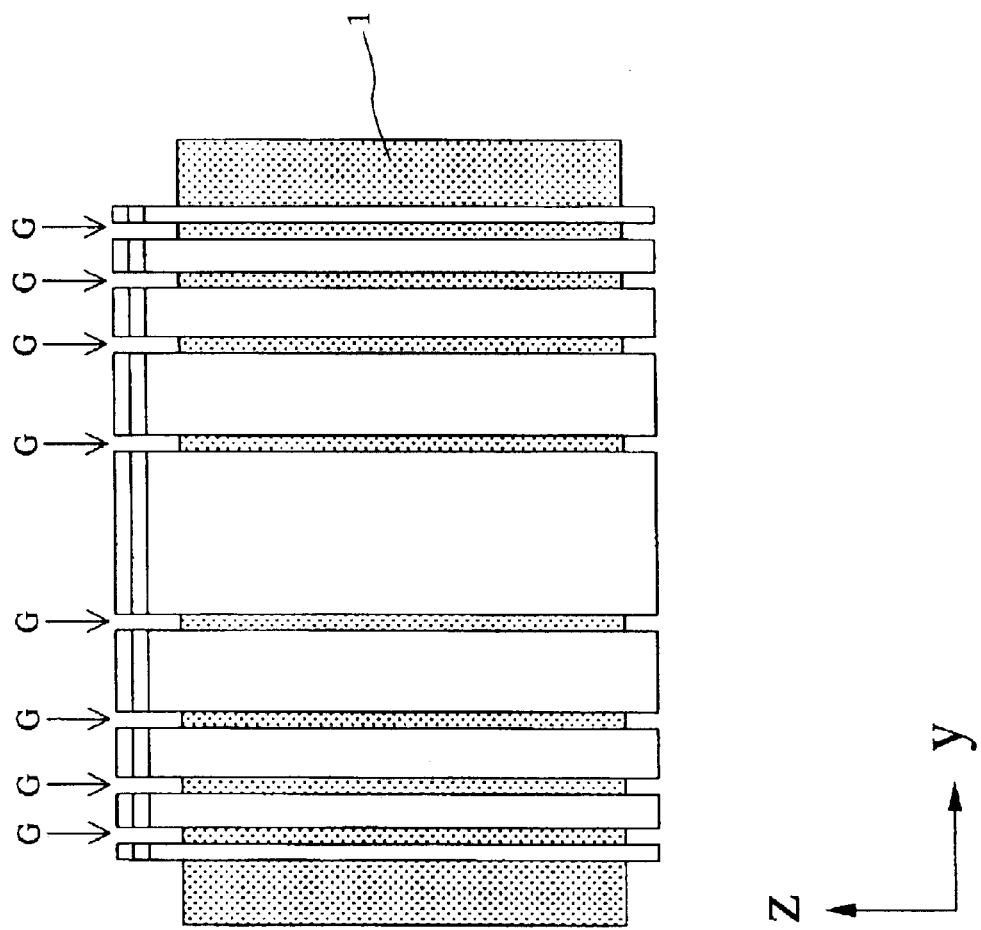
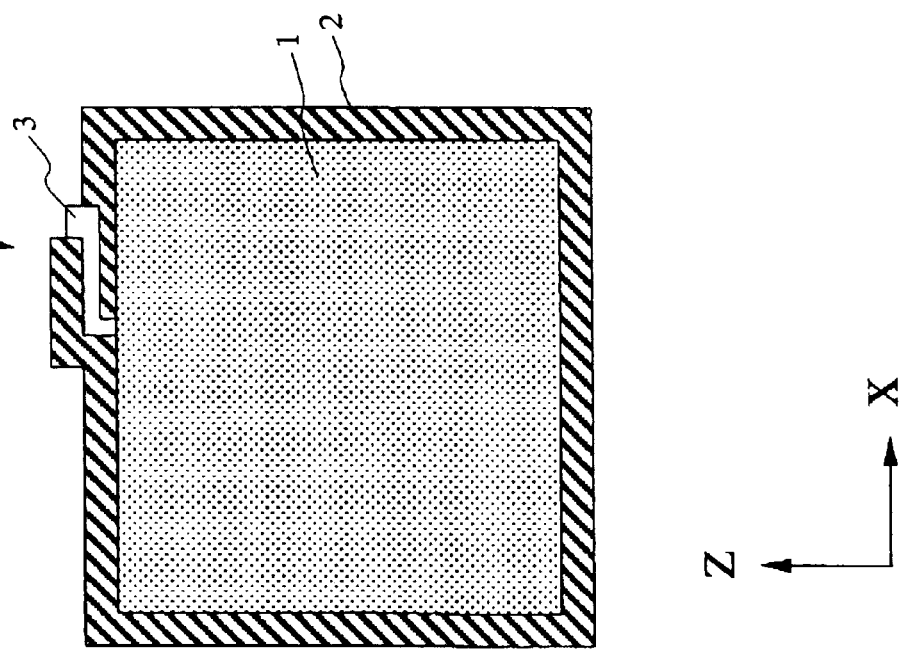

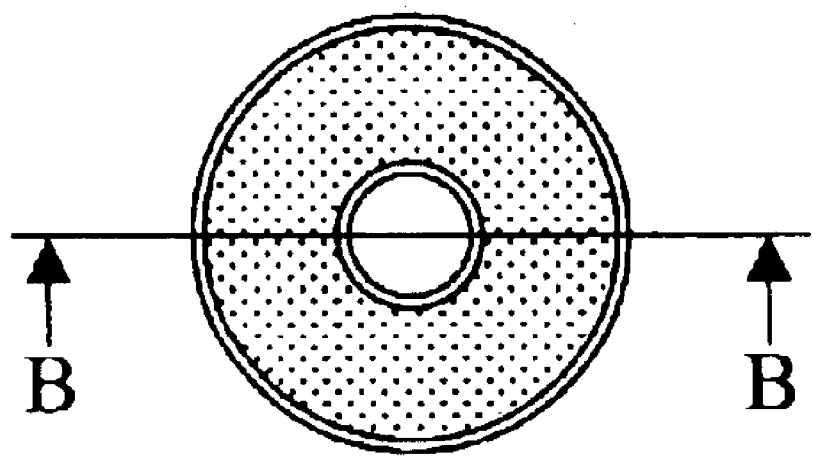
B-B CROSS-SECTION
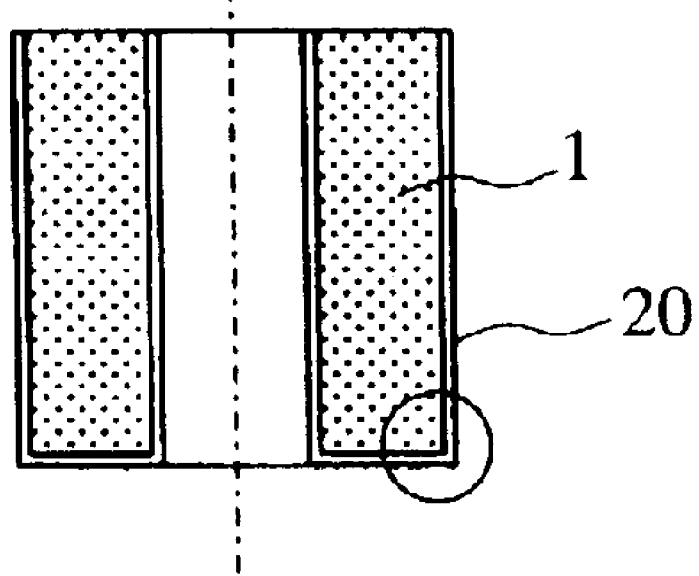
FIG. 20 PRIOR ART

HIGH-FREQUENCY CIRCUIT DEVICE, RESONATOR, FILTER, DUPLEXER, AND HIGH-FREQUENCY CIRCUIT APPARATUS

BACKGROUND OF THE INVENTION

1. Field of the Invention

The present invention relates to a high-frequency circuit device, a resonator, a filter, a duplexer, and a high-frequency circuit apparatus in a microwave band or a millimeter band, used for radio communication and transmission/reception of electromagnetic waves.

2. Description of the Related Art

As a resonator having an electrode film formed on a dielectric substrate, a resonator of a short-circuit circular TM010 mode shown in FIG. 19 and a resonator of a coaxial TEM mode shown in FIG. 20 have been used.

FIG. 19 shows the short-circuit circular TM010 mode resonator viewed from the top, and a cross-sectional view taken along the line A—A thereof. In this example, an electrode 20 is formed on the outer surface of a column-shaped substrate 1. This resonator operates as a short-circuit circular TM010 mode resonator in which the side surface of the column serves as a short-circuit surface.

Also, FIG. 20 shows the coaxial TEM mode resonator viewed from the top, and a cross-sectional view taken along the line B—B thereof. In this example, the electrode 20 is formed on the surface of a cylindrical substrate 1, except the upper surface. With this arrangement, this resonator operates as a coaxial TEM mode resonator which resonates at ¼ wavelength of a used frequency.

A technique of forming a thin-film multilayered electrode, in which a conductive thin-film and a dielectric thin-film are alternately laminated, has been known. With this technique, conductive loss in an electrode formed on the substrate surface can be suppressed. When this technique is applied to a resonator having the configuration shown in FIG. 19 or 20, however, the resonator has an increased loss characteristic. FIG. 21 shows an enlarged view of the circled portion of these figures. In FIG. 21, reference numeral 2 denotes a conductive film and reference numeral 3 denotes a dielectric film.

The known resonator is compact and has a high Q. However, with the demand for miniaturization of high-frequency circuit apparatuses to which these resonators are applied, high-frequency circuit devices such as these resonators are required to be miniaturized, while maintaining a low-loss characteristic.

SUMMARY OF THE INVENTION

An object of the present invention is to provide a high-frequency circuit device, a resonator, a filter, a duplexer, and a high-frequency circuit apparatus which are compact and cause low loss.

A high-frequency circuit device of the present invention comprises a substrate; and an electrode film which is formed on the surface of the substrate and which includes a conductive film and a dielectric film. The conductive film is provided around the substrate such that both ends thereof overlap each other when viewed in a predetermined cross-section of the substrate, and the dielectric film is inserted between both ends of the conductive film so as to mutually insulate both ends of the conductive film.

With this configuration, capacitance is generated at the overlapped portions of the conductive film, with the dielectric film therebetween, and the frequency characteristic is shifted to a low-frequency side by adding the capacitance. Accordingly, the substrate for obtaining a predetermined frequency characteristic can be miniaturized. Also, almost entire electric-field energy is accumulated in the capacitance potion and magnetic-field energy is accumulated inside the substrate, and thus a very compact high-frequency circuit device can be obtained. Further, since little electric-field energy is accumulated inside the substrate, the permittivity and the dielectric loss tangent of the substrate hardly affect the resonance characteristic, and thus a material for the substrate can be freely selected.

The high-frequency circuit device includes two or more conductive films at a non-overlapped portion. By using a thin-film multilayered electrode as the electrode film, conductive loss of the electrode film can be reduced and a high-Q high-frequency circuit device can be obtained. Also, by increasing self-capacitance, the entire high-frequency circuit device can be further miniaturized. Further, the dielectric layer, except the self-capacitance portion, should include an insulating function but the thickness and the permittivity thereof can be arbitrarily set. Thus, the high-frequency circuit device can be freely designed.

Preferably, the thickness of a part or the whole of the conductive film and the dielectric film is substantially the same as or smaller than the thickness of the skin of a conductor at a used frequency. Accordingly, conductive loss can be effectively reduced.

Preferably, a part or the whole of the conductive film and the dielectric film is multi-lined and the width of each line is substantially the same as or smaller than the thickness of the skin of a conductor at a used frequency. With this arrangement, the edge effect can be alleviated and conductive loss can be suppressed.

A resonator of the present invention comprises the substrate of the high-frequency circuit device, the substrate having a substantially hollow cylindrical shape. The electrode film is provided on each of the outer surface and the inner surface of the substrate. Accordingly, the magnetic-field vector inside the substrate draws a loop. Thus, a magnetic-field energy accumulating effect is further increased and a compact and high-Q resonator can be realized.

Also, by forming a waveguide including a rod-shaped substrate and an electrode film which has a self-capacitance portion and which is provided on the outer surface of the substrate, a compact waveguide having a filter function can be realized.

A filter of the present invention comprises the above-described resonator and a signal input/output unit which is coupled to the resonator.

A duplexer of the present invention comprises the above-described filter. The filter is used as at least one of a transmission filter and a reception filter, or the filter is used as both of the transmission and reception filters.

A high-frequency circuit apparatus of the present invention comprises at least one of the above-described filter and the above-described duplexer.

By providing the compact and low-loss filter or duplexer in the high-frequency circuit unit of a communication apparatus, insertion loss can be reduced. Accordingly, a high-frequency circuit apparatus, such as a communication apparatus, having a high communication quality in a noise characteristic and a transmission speed can be obtained.

In a high-frequency circuit device of the present invention, an electrode film including a conductive film and a dielectric film is formed on the surface of a substrate such that the following conditions are satisfied.

A current in the conductive film surrounding the substrate flows in the surrounding direction of the substrate in a predetermined cross-section of the substrate and neither a node nor antinode of an electromagnetic field exists in the direction orthogonal to the cross-section.

Both ends of a current path of the conductive film are close to each other, with the dielectric film therebetween, so that the region near both ends of the conductive film functions as a capacitance portion.

Few nodes or antinodes of a current distribution are generated inside the conductive film portion except the capacitance portion so that the conductive film portion functions as an inductive portion.

A magnetic field which is substantially free of a node or an antinode is induced at the cross-section due to the current flowing through the inductive portion so that a substantially uniform magnetic field is distributed throughout the cross-section, and an electric field is distributed in a small space formed by both closely-placed ends of the conductive film.

BRIEF DESCRIPTION OF THE DRAWINGS

FIGS. 4A and 4B show the distribution of the electric-field vector and the magnetic field vector of another resonator in accordance with the first embodiment;

FIG. 9 is a graph showing the permittivity dependence of the substrate of the resonator;

FIG. 10 is a graph showing the permittivity dependence of the dielectric film of the resonator;

FIGS. 14A and 14B show the configuration of a resonator according to a sixth embodiment;

FIG. 20 shows the configuration of a known resonator of a coaxial TEM mode; and

DESCRIPTION OF THE PREFERRED EMBODIMENTS

Figure 1A:
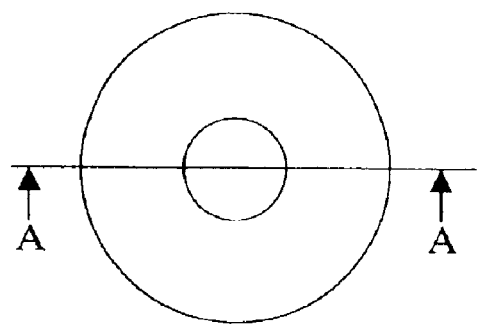
FIGS. 1A, 1B, and 1C show the configuration of a resonator according to a first embodiment.
Figure 1B:
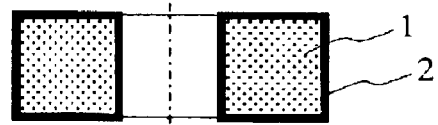
Figure 1C:
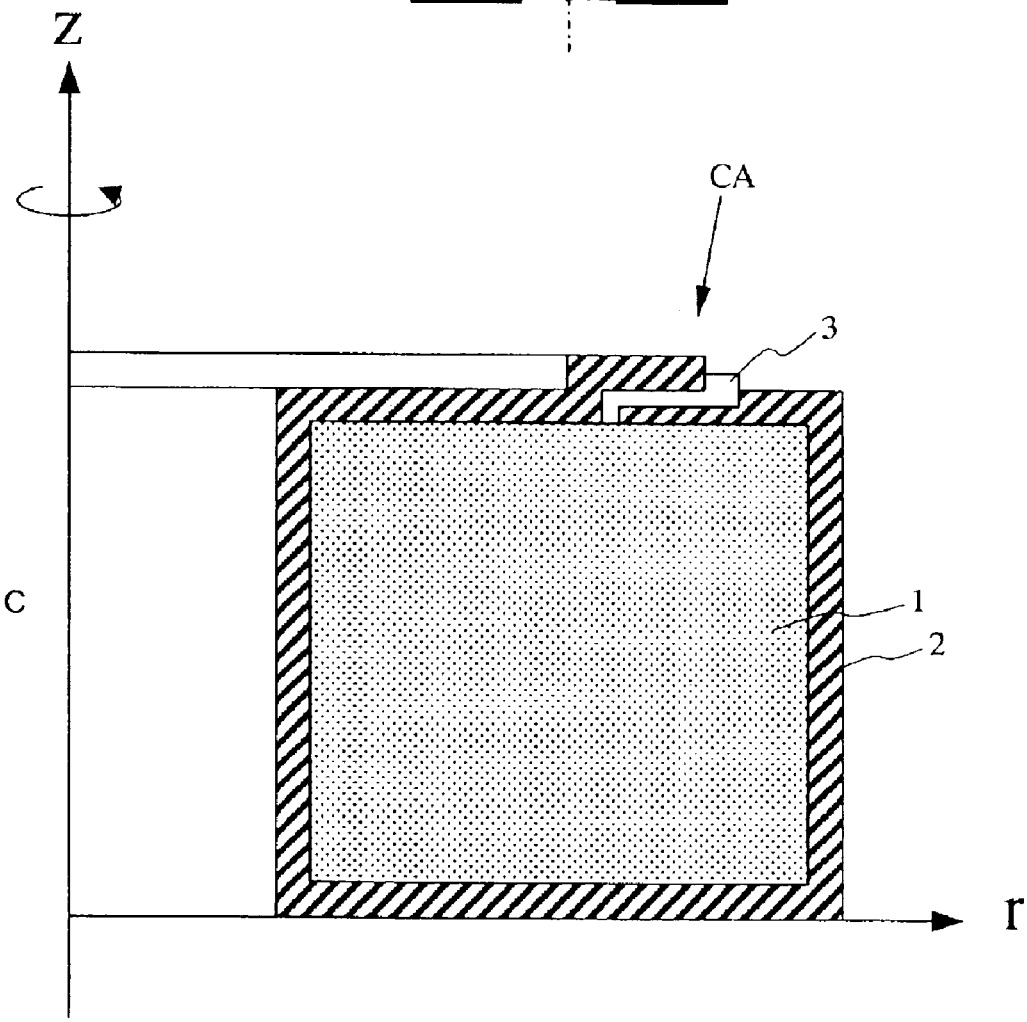

The configuration of a resonator according to a first embodiment will be described with reference to FIGS. 1A to 4B. FIG. 1A shows the resonator viewed from the top, FIG. 1B is a cross-sectional view taken along the line A—A of FIG. 1A, and FIG. 1C is an enlarged view of a right half of the cross-sectional view in FIG. 1B.

The resonator includes a hollow-cylindrical insulative substrate 1. A conductive film 2 is formed on the surface of the substrate 1. In FIG. 1C, the vertical axis is the central axis (z-direction) of the substrate 1, and the horizontal axis is the radius (r-direction). The conductive film 2 is formed such that both ends thereof overlap each other when the periphery of the substrate 1 is viewed in its cross-section. A dielectric film 3 is inserted between the overlapped portions of the conductive film 2 so as to mutually insulate the overlapped portions of the conductive film 2. The overlapped portions of the conductive film 2, which sandwich the dielectric film 3, form a circle on the upper portion of the hollow-cylindrical substrate 1, with the central axis being the center. In this way, an electrode film including the conductive film 2 and the dielectric film 3 is formed.

Figure 2A:
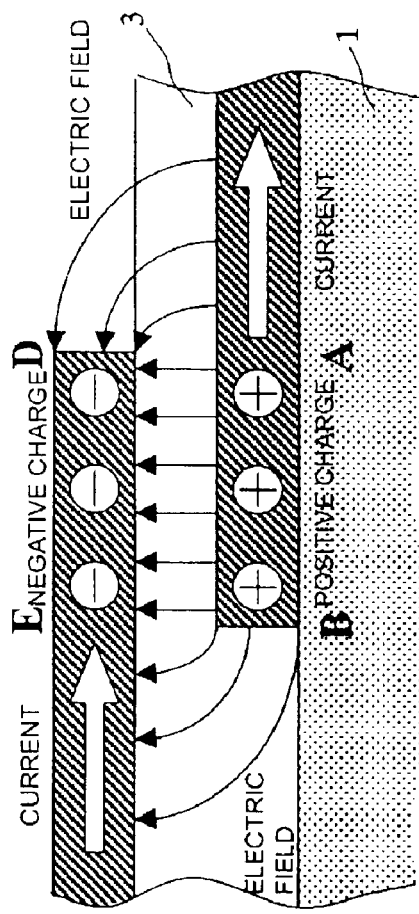
FIGS. 2A, 2B, and 2C illustrate the operation of the resonator of the first embodiment.
Figure 2B:
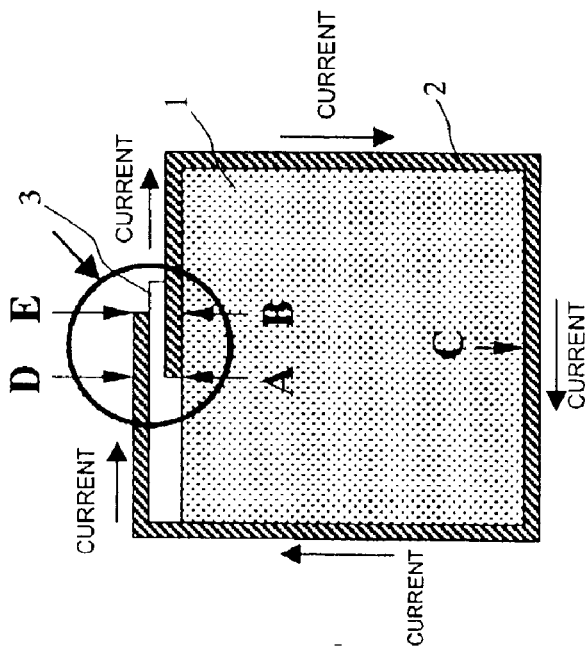
Figure 2C:
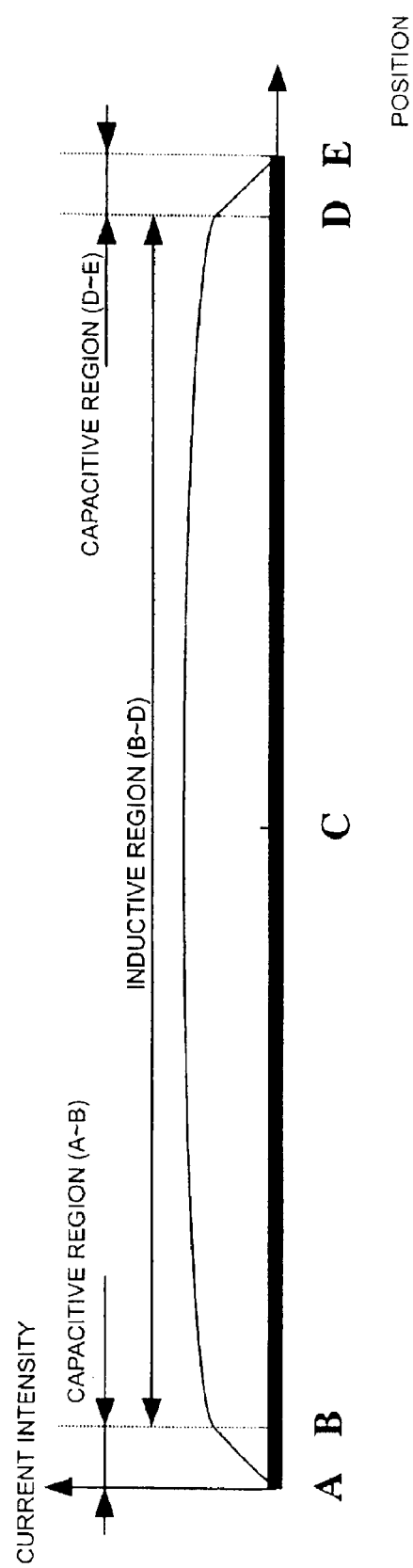

FIGS. 2A to 2C show the operation of this resonator. FIG. 2A shows four positions A, B, D, and E of the overlapped portions of the conductive film 2 and a central position C of the surrounding direction of the conductive film 2 in the cross-section of the resonator. FIG. 2B shows the electric-field distribution at the overlapped portions of the conductive film 2 and the vicinity thereof. FIG. 2C shows the current distribution on the conductive film in the cross-section.

As shown in FIG. 2B, the electric field concentrates at the overlapped portions of the conductive film 2. Also, the electric field concentrates between one end of the conductive film 2 and a side portion near the other end, and a capacitance is generated at these portions.

In FIGS. 1A to 1C, the conductive film 2 is formed such that the cross-section of the overlapped portion of the conductive film 2 is crank-shaped. In FIGS. 2A and 2B, however, both ends of the conductive film 2 overlap each other, keeping a plane shape at the upper surface of the substrate 1 in the figures for clarity.

A current flows in the surrounding direction of the substrate 1 in the cross-section of the substrate 1. As shown in FIG. 2C, in the current distribution, current intensity abruptly increases from position A to position B, is kept at a substantially constant value in the region between positions B and D, and abruptly decreases from position D to position E. The values at both ends are 0. Accordingly, a region between positions A and B and a region between positions D and E, where both ends of the conductive film 2 are close to each other in the thickness direction of the film, can be called capacitive regions, and the other region between positions B and D can be called an inductive region. The capacitive regions and the inductive region perform a resonance operation. If this is regarded as a lumped-constant circuit, an LC resonance circuit is formed.

In this way, since a so-called step impedance structure is formed, electric-field energy concentrates at the capacitive regions and magnetic-field energy concentrates at the inductive region. Thus, the size of the substrate for obtaining a desired resonance frequency can be reduced.

Figure 3A:
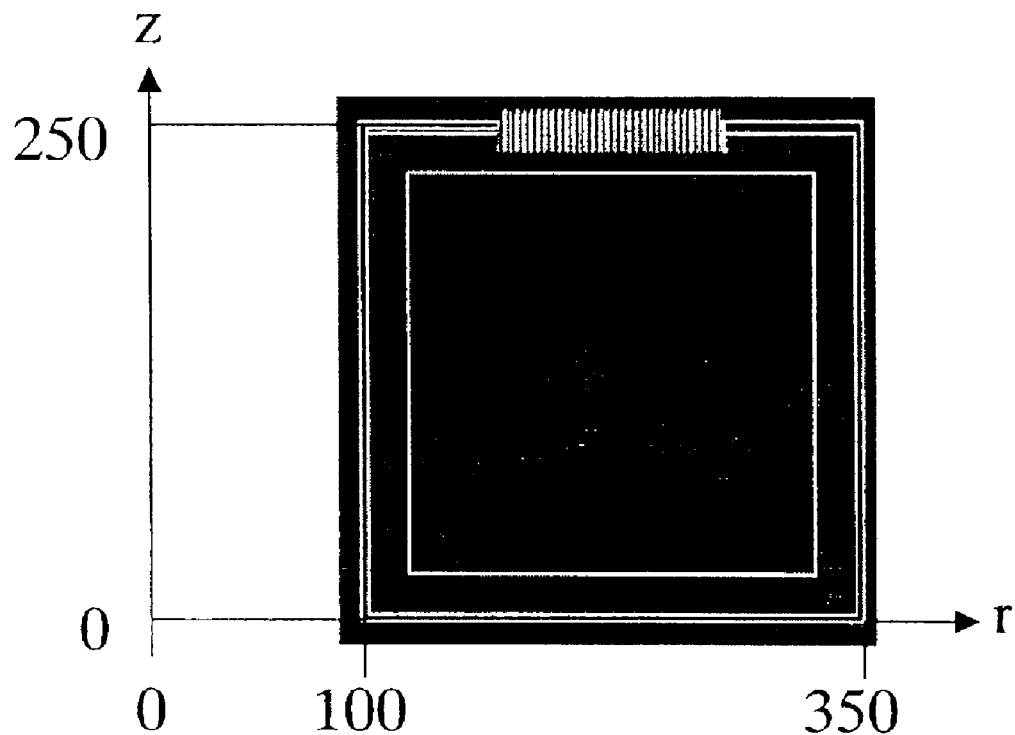
FIGS. 3A and 3B show the distribution of the electric-field vector and the magnetic-field vector of a resonator in accordance with the first embodiment.
Figure 3B:
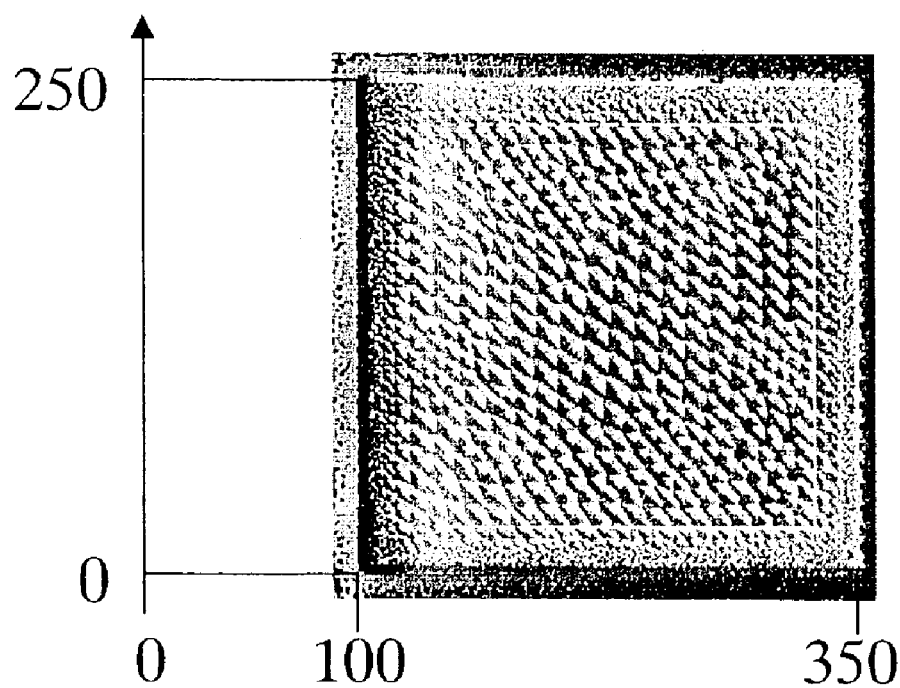

FIGS. 3A to 4B show an analysis result of an electric-field vector distribution and a magnetic-field vector distribution in the cross-section of the resonator. FIGS. 3A and 3B show an example in which the curvature radius of the hollow-cylinder is small, and FIGS. 4A and 4B show an example in which the curvature radius is large. In these figures, the unit of values is $\mu$m. The analysis is performed by a finite element method. The mesh at the periphery of the cross-section of the substrate is fine and the mesh of the other portion is rough. The intensity of the magnetic field is expressed with light and shade.

As shown in FIGS. 3A to 4B, the electric field concentrates at the overlapped portions of the conductive film sandwiching the dielectric film, and the electromagnetic field hardly exists at the other region. Also, the magnetic field is distributed at the inner side of the hollow-cylinder, but an antinode and a node do not exist in the cross-section. Further, the level of bias is small as the curvature radius of the hollow-cylinder is large. In this way, magnetic-field energy is efficiently accumulated in the entire substrate. Accordingly, the resonator operates as a cylindrical coordinate TM000-mode resonator.

As described above, the resonator includes the substrate and the conductive film and the dielectric film surrounding the substrate. The permittivity of the substrate is not a characteristic factor of the resonator, and thus the substrate is preferably molded by using a material which can be easily molded, for example, with an injection method. The conductive film and the dielectric film forming the electrode are formed by using a sputtering method or a plating method, which are thin-film forming techniques.

The operations and advantages of the above-described resonator are as follows:

(1) The electric field concentrates at the overlapped portions of the conductive film sandwiching the dielectric film and capacitance portion is formed. This portion is hereinafter referred to as a self-capacitance portion.

(2) The dielectric film except the self-capacitance portion may have an insulating function, and the thickness and permittivity of the dielectric film may be arbitrarily set.

(3) The magnetic field is distributed inside the substrate so that inductance required for resonance is generated.

(4) The magnetic vector inside the substrate includes a $\phi$ component (axis orthogonal to r and z) and does not have a node nor an antinode in any of $\phi$, r, and z directions.

(5) Electronic-field energy is hardly accumulated inside the substrate, and thus the permittivity and dielectric loss tangent (tan $\delta$) hardly affect the resonance characteristic. Therefore, the substrate preferably should comprise an insulative material. If the substrate comprises a magnetic material, however, a magnetic-field energy accumulation ability is enhanced, which is more effective for miniaturization.

(6) By setting the thickness of the conductive film 2 at a value larger than the thickness of the skin of a conductor at a used frequency, the magnetic field energy inside the substrate is blocked.

Next, the configuration of a resonator according to a second embodiment will be described with reference to FIGS. 5A to 5C. In the resonator shown in FIGS. 1A to 1C, a circular hollow-cylindrical substrate is used. In the second embodiment, however, a square hollow-cylindrical substrate is used. Further, the corners of inner and outer sides of the square cylinder are chamfered.

Figure 5A:
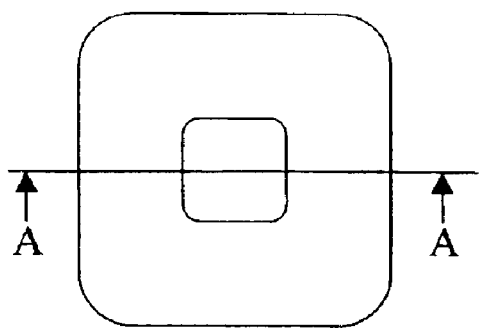
FIGS. 5A, 5B, and 5C show the configuration of a resonator according to a second embodiment.
Figure 5B:
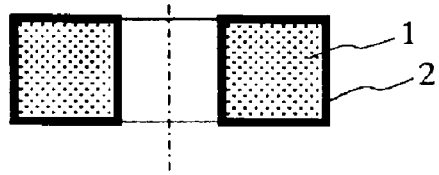
Figure 5C:
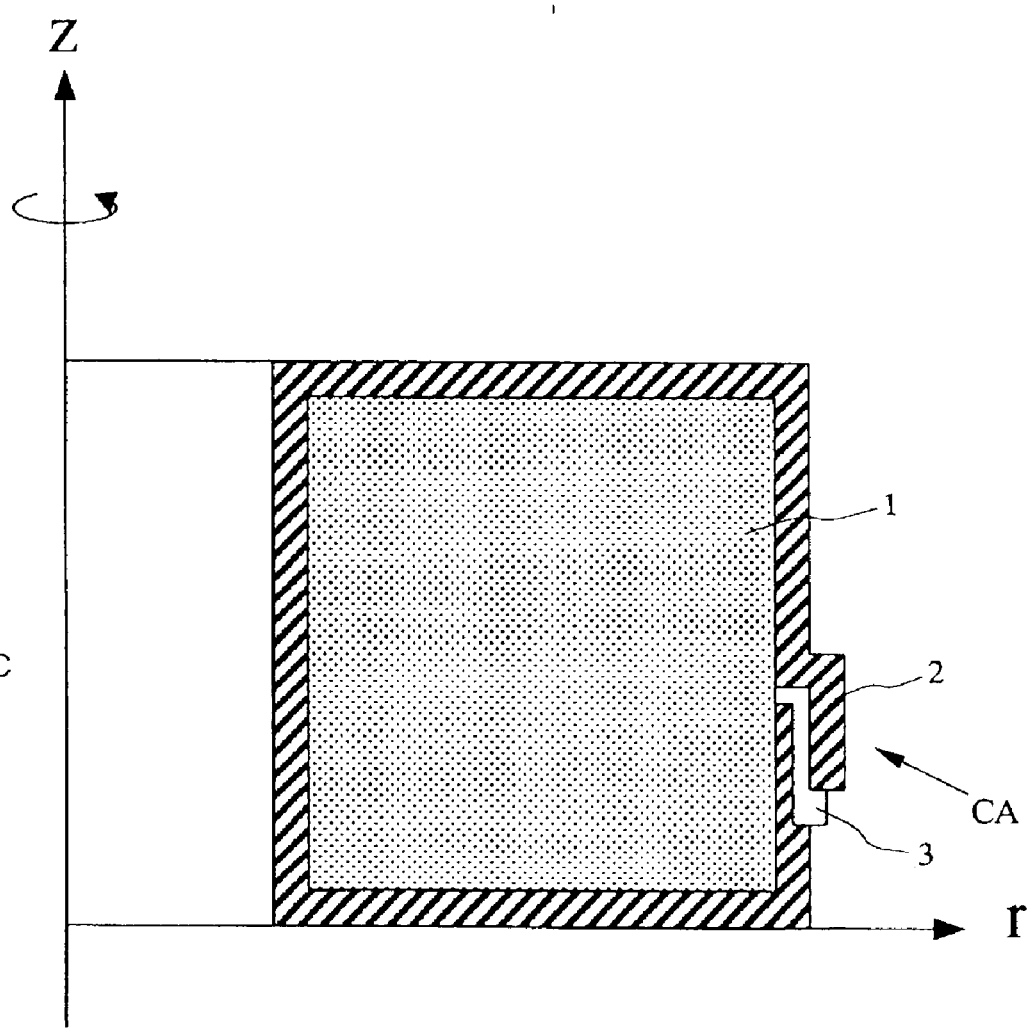

FIG. 5A shows the resonator viewed from the top, FIG. 5B is a cross-sectional view taken along the line A—A of FIG. 5A, and FIG. 5C is an enlarged view of a right half of the cross-sectional view in FIG. 5B.

Unlike in FIGS. 1A to 1C, a self-capacitance portion CA is provided at the outer surface of the substrate 1 in the circumference direction. With this configuration, the peripheral length of the self-capacitance portion CA increases, and the capacitance generated at that portion can be increased accordingly. Therefore, the substrate 1 for obtaining a predetermined resonance frequency can be further miniaturized.

Further, only the conductive layer 2 exists on the upper and lower surfaces of the substrate 1 in FIG. 5C. Thus, the self-capacitance portion CA is not damaged and mechanical holding on the upper and lower surfaces of the resonator can be easily realized. Accordingly, even if the substrate 1 is not a perfect circular hollow-cylinder, the same operations and advantages as in the first embodiment can be obtained.

Figure 6A:
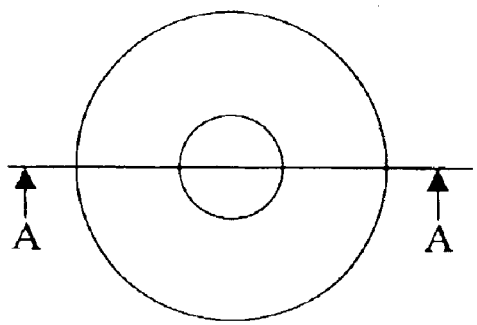
FIGS. 6A, 6B, and 6C show the configuration of a resonator according to a third embodiment.
Figure 6B:
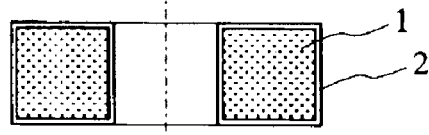
Figure 6C:
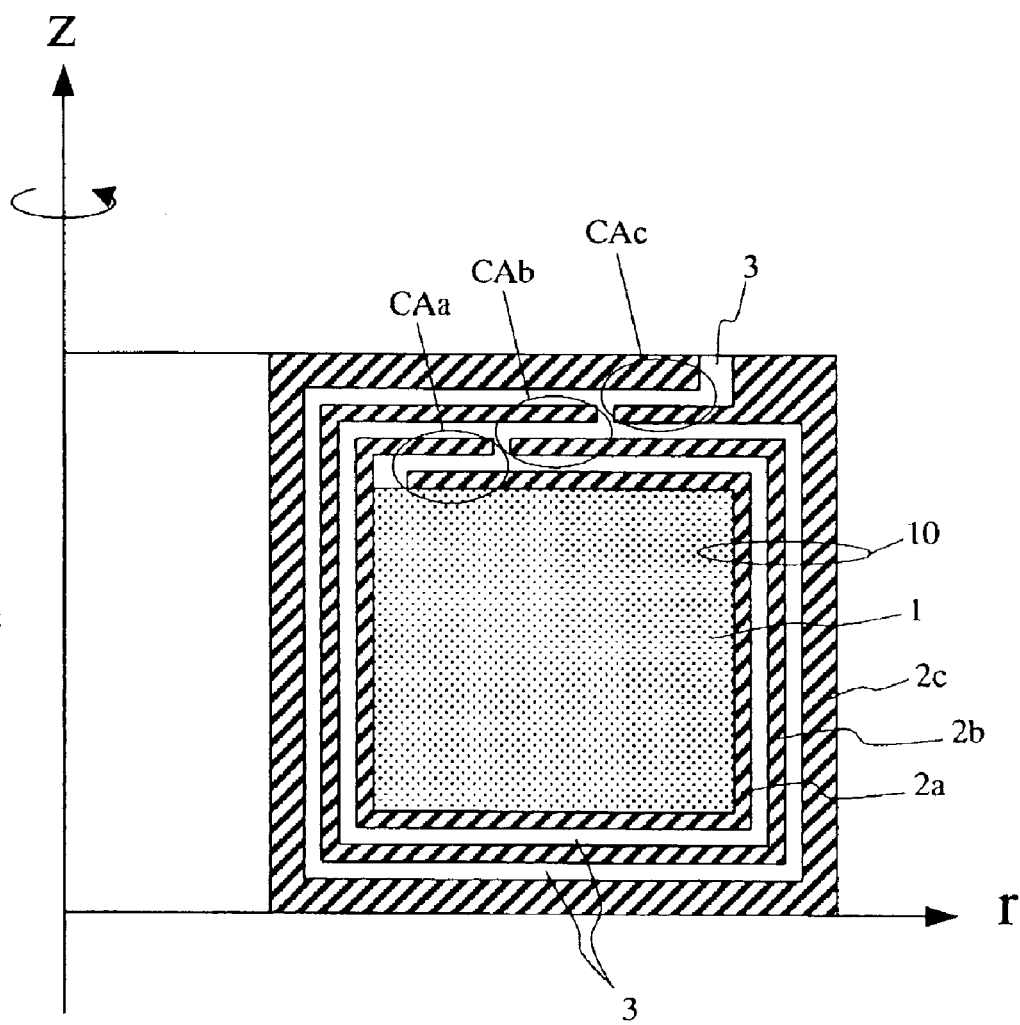

Next, the configuration of a resonator according to a third embodiment will be described with reference to FIGS. 6A to 10. FIG. 6A shows the resonator viewed from the top, FIG. 6B is a cross-sectional view taken along the line A—A of FIG. 6A, and FIG. 6C is an enlarged view of a right half of the cross-sectional view in FIG. 6B.

Unlike in the first embodiment, this resonator includes a thin-film multilayered electrode 10 which is formed on the surface of the substrate 1. This thin-film multilayered electrode 10 is formed by alternately laminating a conductive film and a dielectric film. In FIG. 6C, Reference numerals 2a, 2b, and 2c denote conductive films and reference numeral 3 denotes a dielectric film sandwiched by the conductive films.

The resonator also includes a self-capacitance portion CAa formed by overlapping both ends of the conductive film 2a, with the dielectric film 3 therebetween; a self-capacitance portion CAb formed by overlapping both ends of the conductive film 2b, with the dielectric film 3 therebetween; and a self-capacitance portion CAc formed by overlapping both ends of the conductive film 2c, with the dielectric film 3 therebetween. In this embodiment, the self-capacitance portion CAb is positioned near the self-capacitance portion CAa so that a layer outside the conductive film 2a forming a part of the self-capacitance portion CAa is the same as a layer inside the conductive film 2b forming a part of the self-capacitance portion CAb. Likewise, the self-capacitance portion CAc is positioned near the self-capacitance portion CAb so that a layer outside the conductive film 2b forming a part of the self-capacitance portion CAb is the same as a layer inside the conductive film 2c forming a part of the self-capacitance portion CAc.

With this configuration, each of the conductive film and the dielectric film is not stepped, and thus the thin-film multilayered electrode can be easily formed.

Further, the thickness of each of the conductive films 2a and 2b is equal to or less than the thickness of the skin of a conductor at a used frequency. The thickness of the conductive film 2c, which is the outer layer of the thin-film multilayered electrode 10, is larger than the thickness of the skin of the conductor at a used frequency. Accordingly, the conductive film 2c blocks the magnetic-field energy inside the substrate 1.

In this way, by using a thin-film multilayered electrode as an electrode film, electrode density is distributed to each layer of the conductive film and the entire conductive loss is reduced. Accordingly, a high-Q resonator can be obtained. Also, the self-capacitance portions CAa, CAb, and CAc can be provided, the number of self-capacitance portions corresponding to the number of conductive films. When such a thin-film multilayered electrode is used, the conductive film and the dielectric film are formed by using a sputtering method or a plating method, which are thin-film forming techniques.

The operations and advantages of the thin-film multilayered electrode are as follows:

(1) Q of the resonator increases in accordance with an increase in the number of layers of the thin-film multilayered electrode 10.

(2) The sum of the self-capacitances of the conductive films is the capacitance of the substantially entire resonator, and the resonator can be miniaturized in accordance with an increase in the capacitance.

(3) By setting the thickness of the outer conductive film of the thin-film multilayered electrode larger, the magnetic-field energy inside the substrate can be blocked while maintaining low loss of a thin-film multilayer.

Figure 7A:
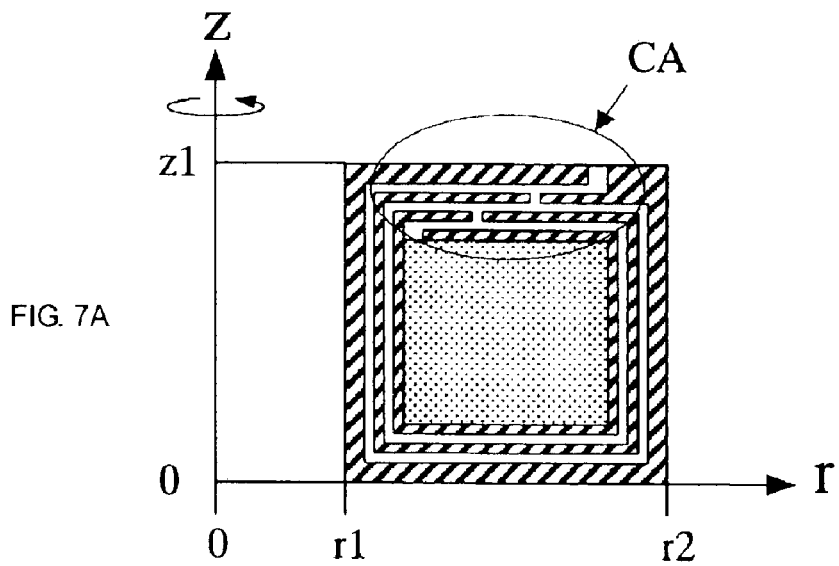
FIGS. 7A and 7B show the dimension of each part of the resonator.
Figure 7B:
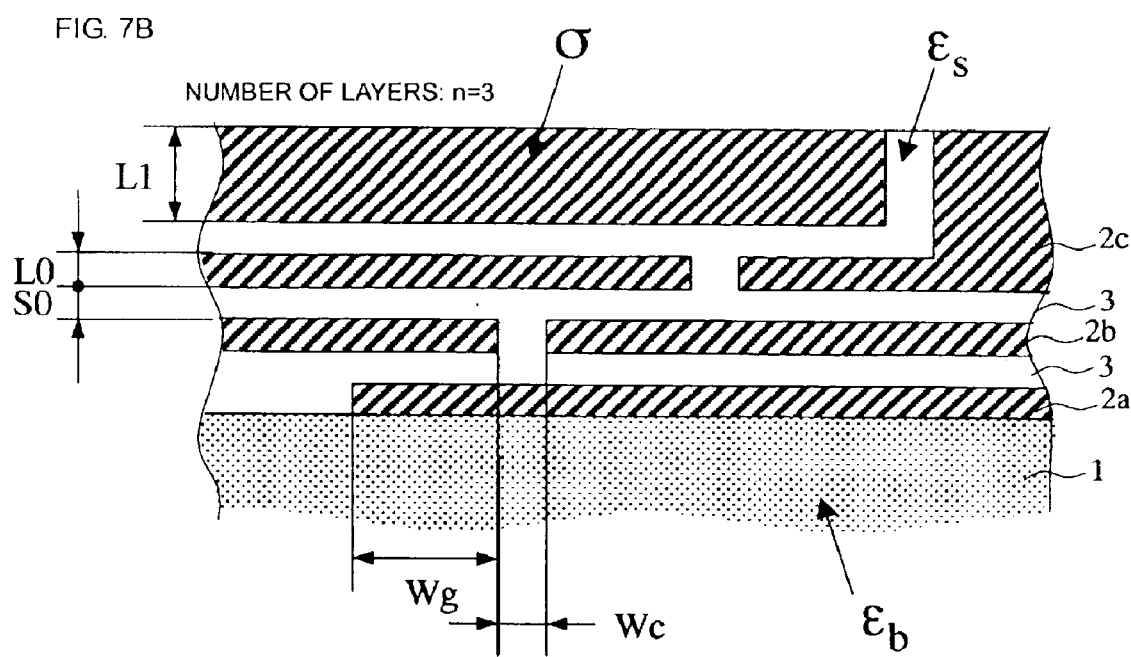

FIGS. 7A and 7B show the dimension of each part of the resonator. FIG. 7A is a one-side cross-section of an r-z surface of the resonator and FIG. 7B is an enlarged cross-sectional view of the self-capacitance portion CA in FIG. 7A. The dimension of each part is as follows:

r1=100 $\mu$m r2=350 $\mu$m z1=250 $\mu$m

S0=0.1 $\mu$m

L1=4.0 $\mu$m

Wc=1.3 $\mu$m $\sigma$=53×10$^6$ S/m $\in$s=8.5

$\in$b=80

L0 and Wg are parameters.

Figure 8:
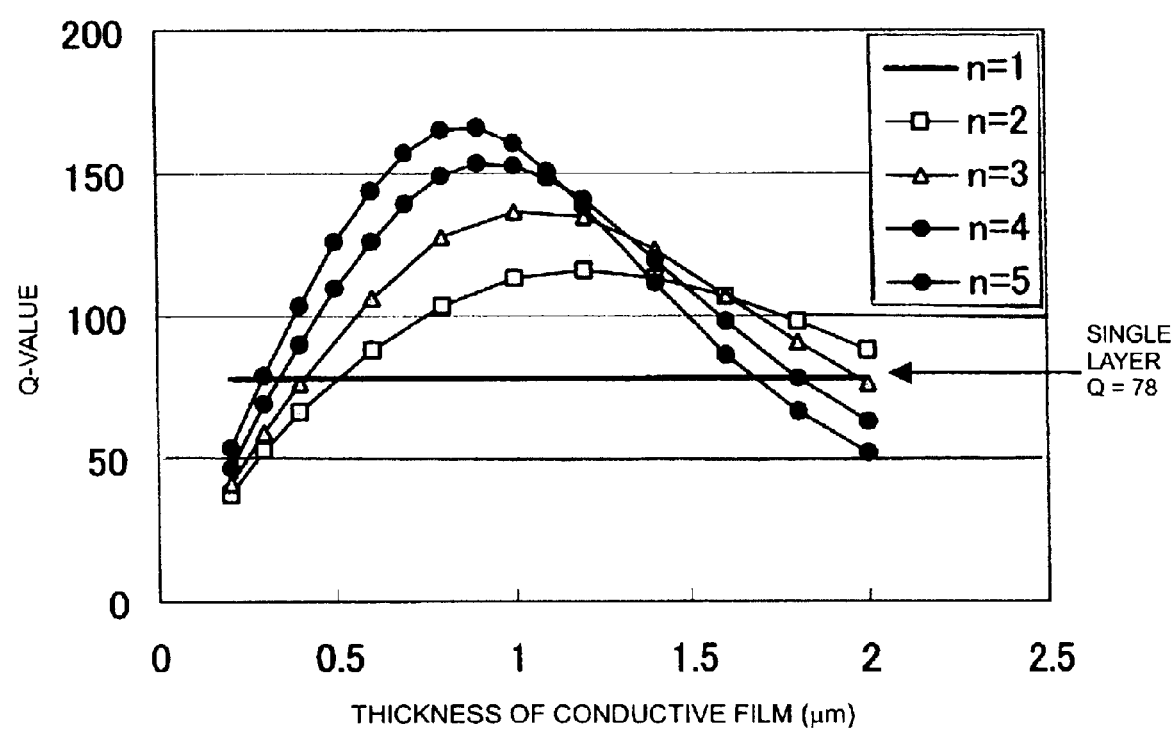
FIG. 8 is a graph showing the relationship between the thickness of a conductive film and the Q-value of the resonator.

FIG. 8 shows the relationship between the thickness of the conductive film of each layer and Q of the resonator. Herein, n is the number of conductive films. As can be seen, there is an optimal film thickness according to the number of layers. Therefore, the thickness of the conductive film is set according to the number of conductive films so that the highest Q can be obtained.

The result of the optimal design for a resonance frequency fo=2 GHz is as follows.

TABLE 1

| Number of layers (n) | Thickness of conductive film L0 ($\mu$m) | Value of Q (Q) | Rate of increase in Q (Qup) |
|---|---|---|---|
| 1 | — | 78 | 1 |
| 2 | 1.20 | 116 | 1.48 |
| 3 | 1.06 | 137 | 1.76 |
| 4 | 0.95 | 153 | 1.97 |
| 5 | 0.86 | 166 | 2.12 |

FIG. 9 shows the permittivity dependence of the substrate. As shown in FIGS. 3A to 4B since electric-field energy is not accumulated inside the substrate 1, the electrical characteristic of the resonator hardly depends on the permittivity of the substrate, as shown in FIG. 9. Thus, a material for the substrate can be freely selected.

FIG. 10 shows the permittivity dependence of the dielectric film 3. Electric-field energy is not accumulated in the substrate 1 and is accumulated in the dielectric film 3. Thus, the resonance frequency of the resonator is inversely proportional to the square root of the relative permittivity of the dielectric film. Also, Q-value changes in accordance with change in the frequency.

Next, a waveguide according to a fourth embodiment will be described with reference to FIGS. 11, 12A, and 12B.

Figure 11:
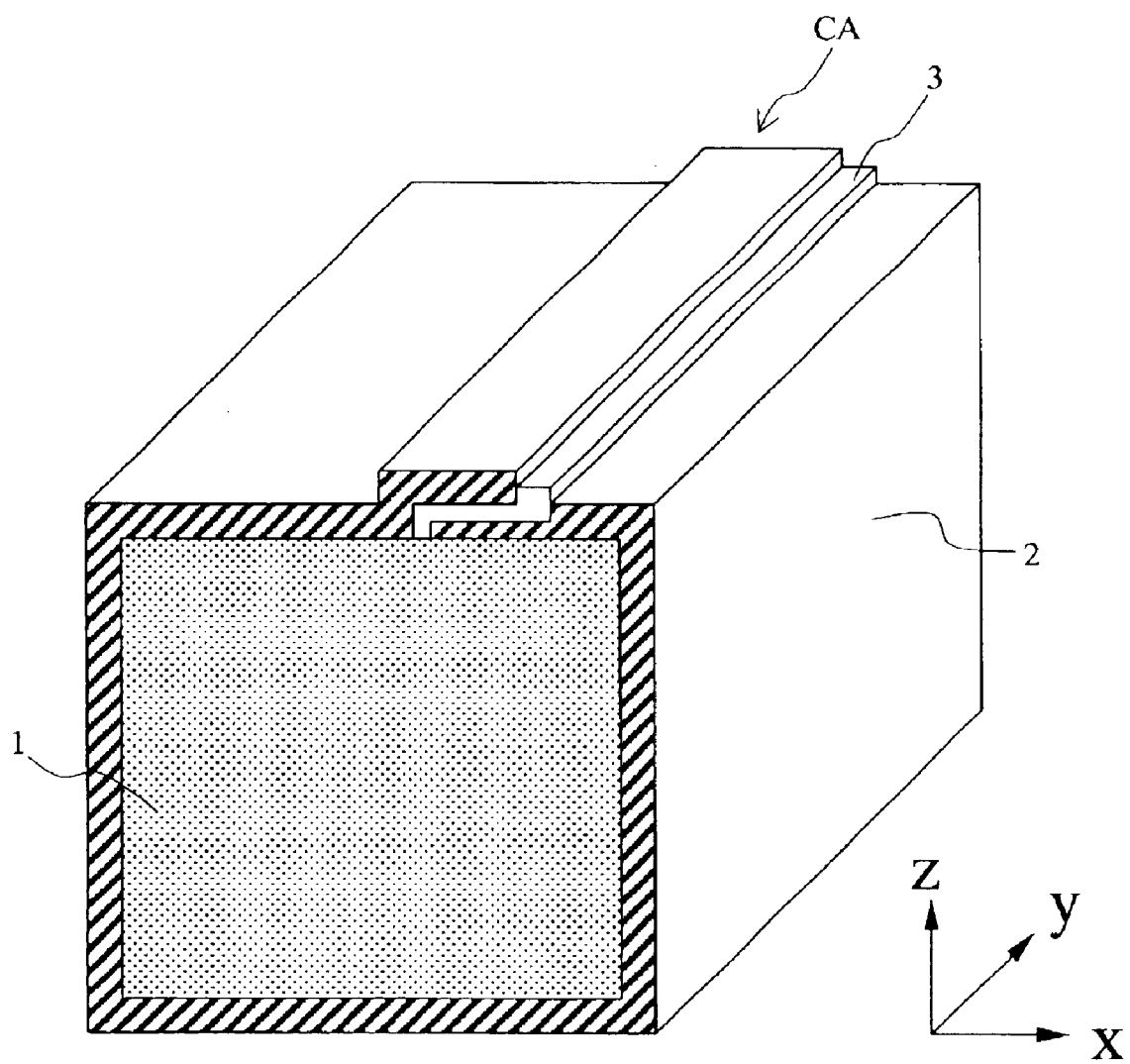
FIG. 11 shows the configuration of a waveguide according to a fourth embodiment.

FIG. 11 is a perspective view of the waveguide. The waveguide includes the substrate 1 and the conductive film 2 formed on the surface thereof. Cartesian coordinates of x, y, and z, where y-axis is the direction in which the substrate 1 extends (direction of signal propagation), are provided. In FIG. 11, the conductive film 2 is formed such that both ends thereof overlap each other while sandwiching the dielectric film 3, in the x-z cross-section. The overlapped portions of the conductive film 2 sandwiching the dielectric film 3 is a self-capacitance portion CA. Accordingly, the self-capacitance portion CA extends along the direction of signal propagation.

Figure 12A:
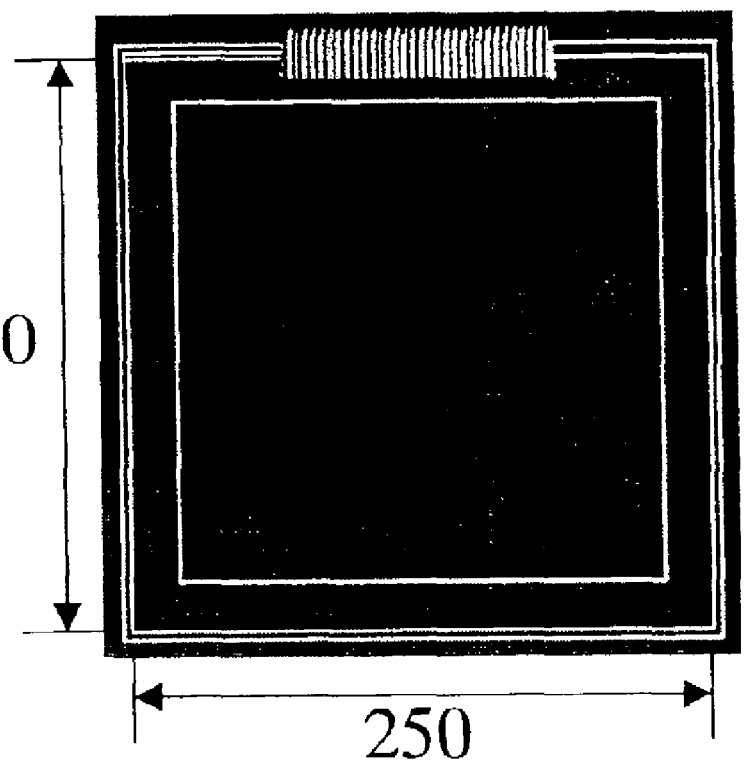
FIGS. 12A and 12B show an example of the electric-field vector and the magnetic-field vector of the waveguide of FIG. 11.
Figure 12B:
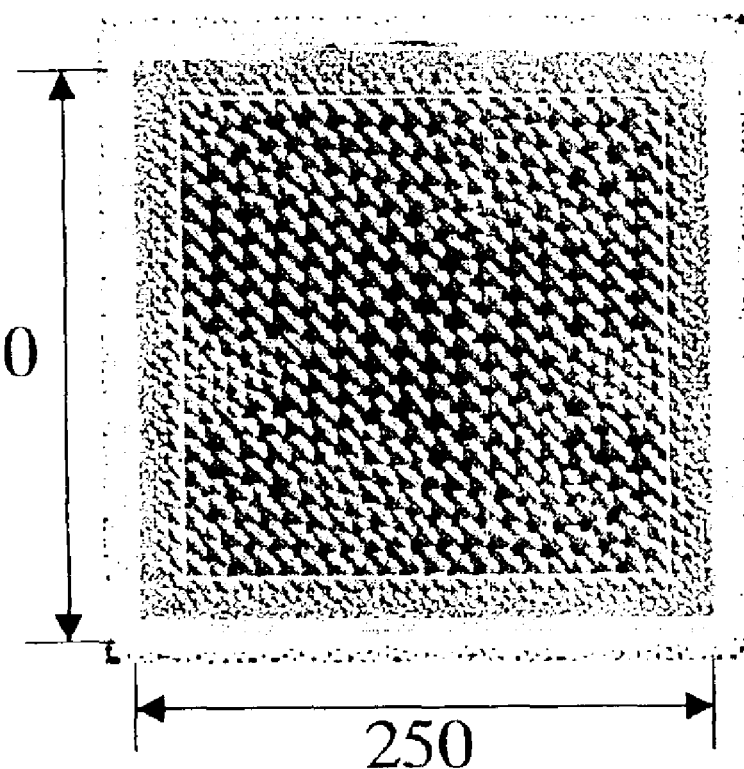

FIG. 12A shows the electric-field vector distribution in the x-z surface and FIG. 12B shows the magnetic-field vector distribution in the x-z surface. Herein, the unit of the values is $\mu$m. Also, this waveguide is linear in which the curvature of the substrate is 0. As in the resonator according to the first embodiment, the electric field concentrates at the overlapped portions of the conductive film sandwiching the dielectric film, and hardly exists in the other region. Further, the magnetic field is distributed inside the hollow-cylinder, but an antinode and a node do not exist in the cross-section.

As described above, since a self-capacitance portion is formed at the electrode at the periphery of the substrate 1, a waveguide having a frequency characteristic is realized. The resonance frequency highly depends on the shape of the cross-section (x-z surface), which is orthogonal to the direction of signal propagation. Also, the nonloaded Q of the resonator can be set in accordance with the length of the direction orthogonal to the cross-section. Generally, Q of a line becomes high as the loop of the magnetic-field vector by a signal transmitted through the line becomes wider. In this waveguide, the magnetic-field vector draws a loop in the longitudinal direction of the substrate 1. However, as the length of the substrate 1 increases, the loop occupies a large volume, and thus the nonloaded Q of the resonator increases. That is, the insertion loss in the resonance frequency of a passing characteristic is reduced as the length of the waveguide is increased.

Therefore, by adequately setting the length of the waveguide, both functions of a resonator and a waveguide can be obtained. That is, a waveguide having a filter function can be obtained.

In general, when a desired filter characteristic is to be obtained, the size of the filter is determined and the length in the direction of signal propagation is also determined. However, when such a waveguide having a filter function is used, the shape of a cross-section for obtaining the desired filter characteristic for a length can be designed even if the length is predetermined. Thus, a high-frequency circuit device having a filter characteristic can be realized, while the length thereof can being freely set.

Figure 13:
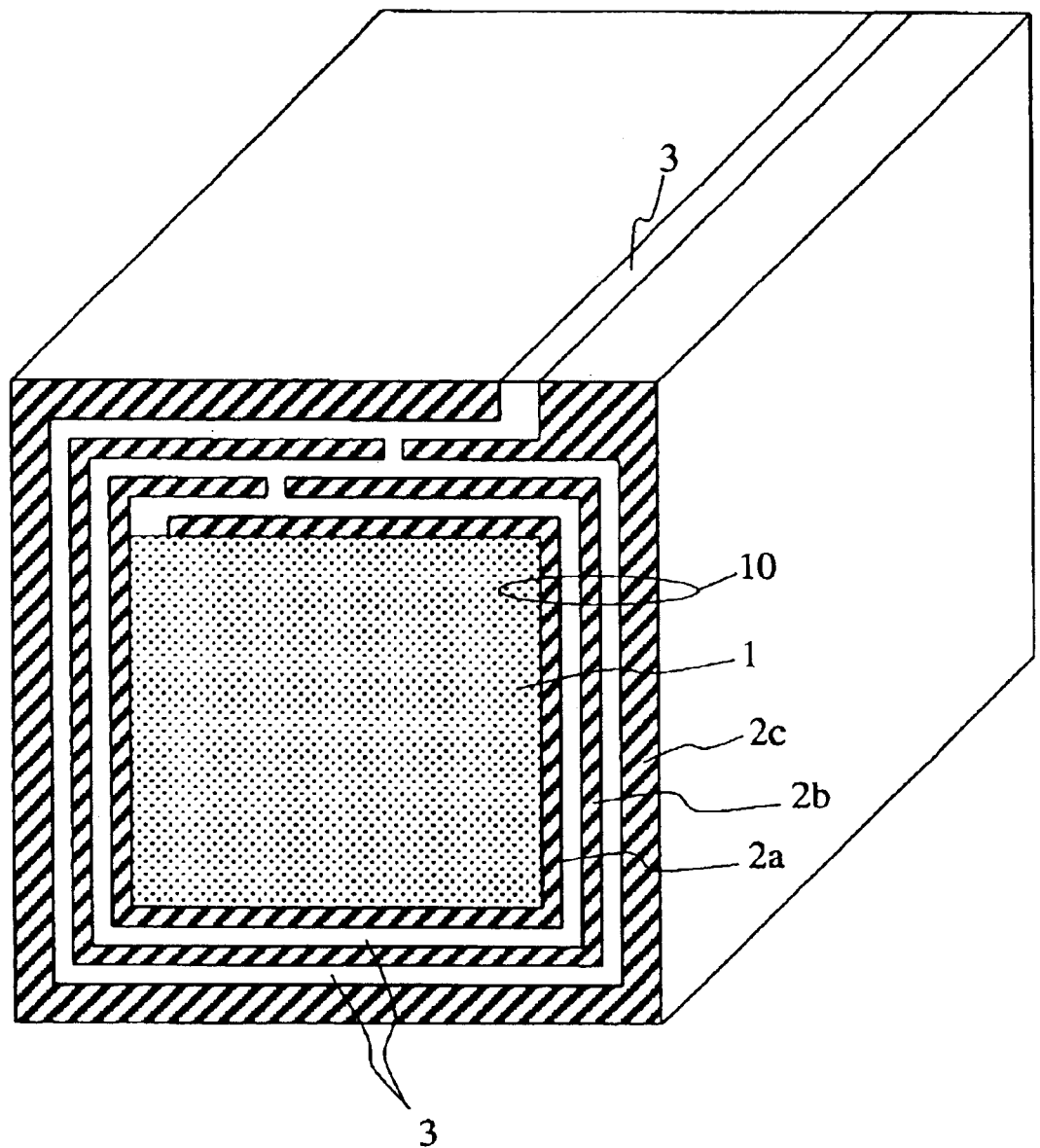
FIG. 13 shows the configuration of a waveguide according to a fifth embodiment.

FIG. 13 is a perspective view of a waveguide according to a fifth embodiment. This waveguide is different from the waveguide according to the fourth embodiment in that a thin-film multilayered electrode is used as an electrode film.

In FIG. 13, the waveguide includes conductive films 2a, 2b, and 2c, and a dielectric film 3. A thin-film multilayered electrode which is formed by alternately laminating the conductive film and the dielectric film is formed around the substrate 1. The cross-section structure of this waveguide is the same as that shown in FIG. 6C. With this structure, conductive loss due to the electrode film can be suppressed and propagation loss in the waveguide can be suppressed.

Next, the configuration of a resonator according to a sixth embodiment will be described with reference to FIGS. 14A to 15B.

FIG. 14A is a cross-sectional view taken along the x-z surface of the resonator and FIG. 14B is a front view of the resonator in the x-direction. In FIGS. 14A and 14B, the resonator includes a prism substrate 1. The conductive film 2 is formed on the surface of the substrate 1 such that both ends of the conductive film 2 overlap each other when viewed in the cross-section taken along the x-z surface. The dielectric film 3 is inserted between both ends of the conductive film 2. Accordingly, a self-capacitance portion CA is formed at the portion in which both ends of the conductive film 2 overlap, with the dielectric film 3 therebetween. In FIG. 14B, character G denotes a gap which is formed along the x-z surface, and the conductive film 2 and the dielectric film 3 are not formed on this space G. In this way, by providing a plurality of gaps G, the electrode film around the substrate 1 is formed in a multi-lined manner. Accordingly, the edge effect can be alleviated so that conductive loss is suppressed.

Figure 15A:
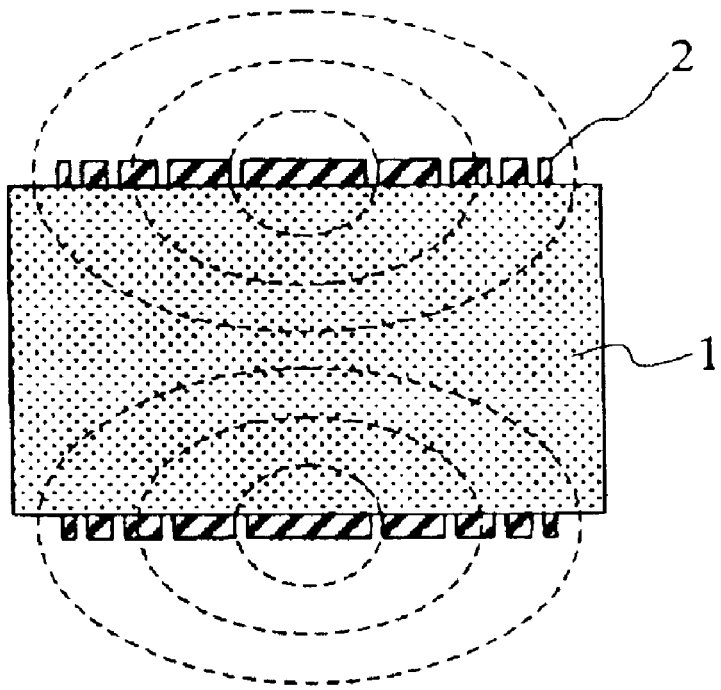
FIGS. 15A and 15B show examples of the magnetic-field vector of the resonator of FIGS. 14A and 14B.
Figure 15B:
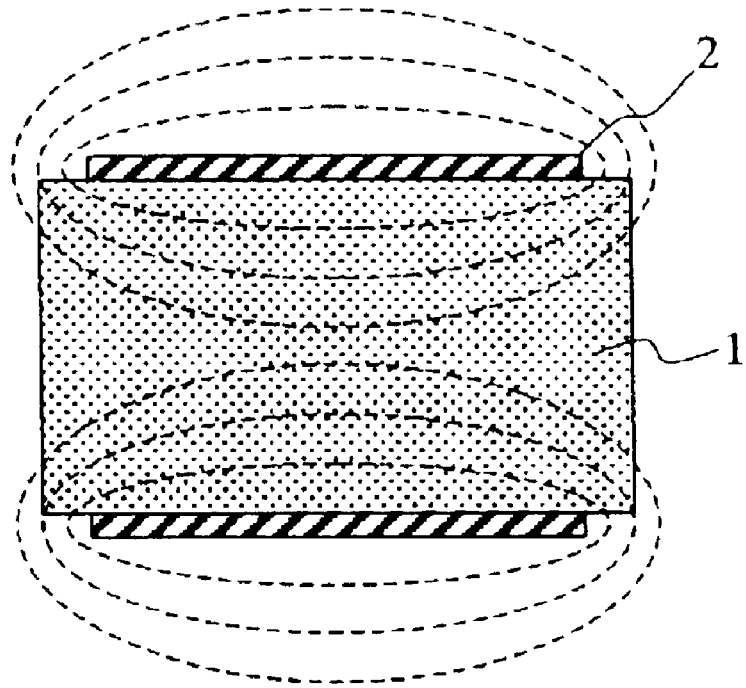

FIG. 15A shows an example of a magnetic-field distribution in the y-z surface. FIG. 15B shows the configuration of the resonator according to a comparative example. In this example, gaps G are not provided and the conductive film 2 is continuously formed in the y-direction.

When gaps G are not provided, a magnetic field concentrates at the edges of the electrode. On the other hand, when gaps G are provided as shown in FIG. 15A, the magnetic field passes through the gaps G, the edge effect is alleviated, and thus a low-loss operation can be achieved.

Further, the gaps G are densely provided in the vicinity of both ends of the electrode film, in which an edge effect is significant. With this arrangement, the edge effect can be suppressed and thus conductive loss of the entire electrode film can be effectively reduced.

In such a resonator including a prism substrate and an electrode which is formed on the side surface of the substrate and which has a self-capacitance portion CA, electric-field energy concentrates at only the self-capacitance portion CA and magnetic-field energy is distributed inside the substrate 1. Therefore, a step impedance structure can be realized and the entire resonator can be miniaturized.

Further, by using a multi-lined electrode film and by setting the line width smaller, an edge effect can be alleviated and a loss reduction effect increases.

Figure 16A:
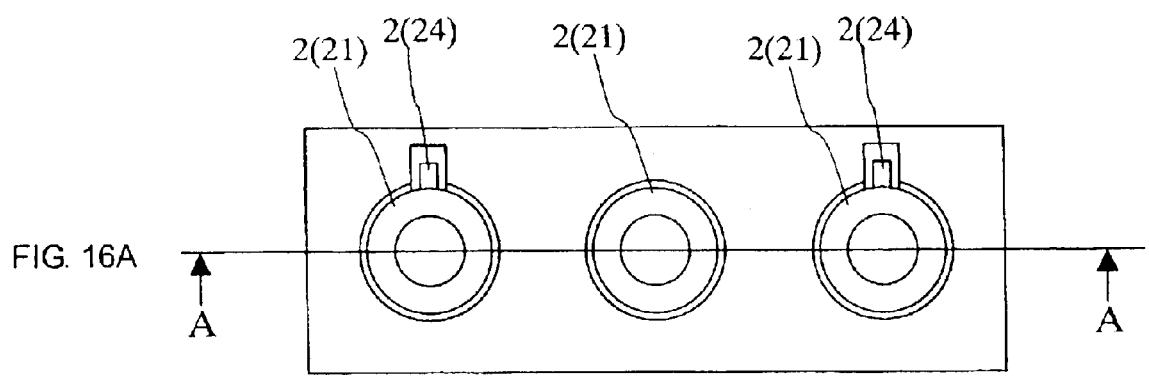
FIGS. 16A, 16B, 16C, and 16D show the configuration of a filter according to a seventh embodiment.
Figure 16B:
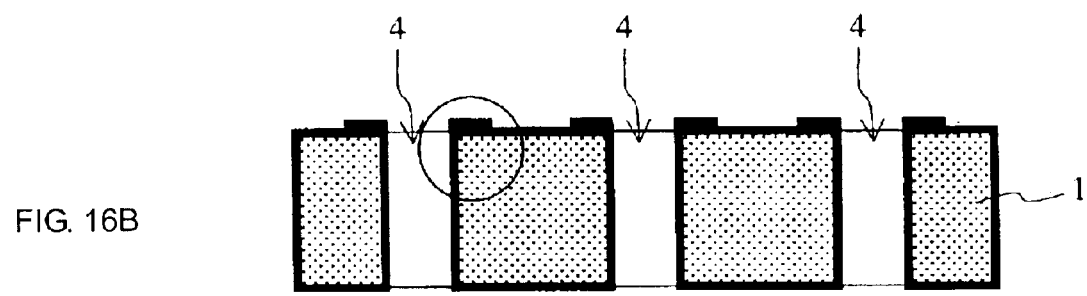
Figure 16C:
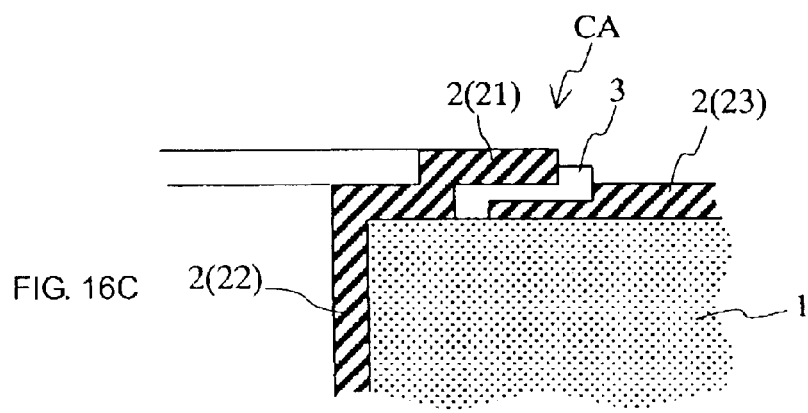

Next, the configuration of a filter according to a seventh embodiment will be described with reference to FIGS. 16A to 16D. FIG. 16A shows the filter viewed from the top, FIG. 16B is a cross-sectional view taken along the line A—A of FIG. 16A, FIG. 16C is an enlarged view of an encircled portion of FIG. 16B, and FIG. 16D is a cross-sectional view of an input/output conductive portion, which will be described later.

In FIGS. 16A to 16D, the filter includes a rectangular parallelepiped substrate 1 and three holes 4. The conductive film 2 is formed on the outer surface of the substrate 1 and on the inner surfaces of the holes 4. The self-capacitance portion CA is formed at the upper part of the substrate 1. The self-capacitance portion CA is formed by overlapping both ends of the conductive film 2, with the dielectric film 3 therebetween, viewed in the cross-section shown in FIG. 16B. The electrode film 2 which is formed on the inner surfaces of the holes 4 functions as an inner conductor 22 and the conductive film 2 which is formed on the outer surface of the substrate 1 functions as an outer conductor 23. Therefore, coaxial resonators of ¼ wavelength having an end capacitance at the self-capacitance portion CA is realized. In the three coaxial resonators, adjoining resonators are inductively coupled.

Figure 16D:
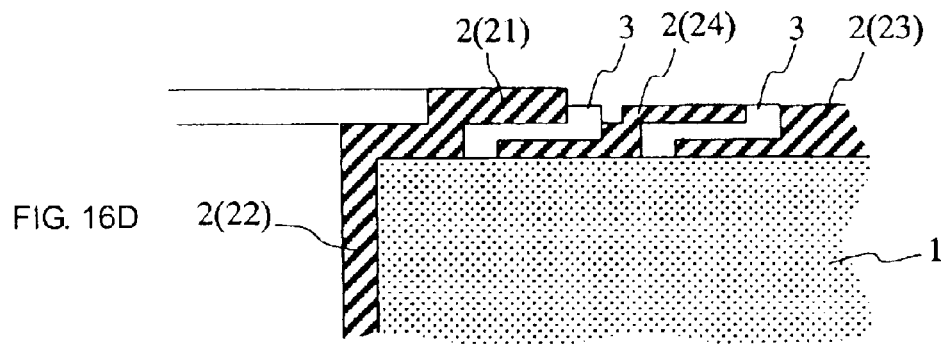

Also, as shown in FIG. 16D, the dielectric film 3 is sandwiched between the input/output conductor 24 and an additional conductor 21 and between the input/output conductor 24 and the outer conductor 23. With this arrangement, the input/output conductor 24 performs capacitive coupling via the capacitance generated between the input/output conductor 24 and the additional conductor 21. Accordingly, a filter which has the same operations and advantages as those of the above-described resonator and which has compact and low-loss characteristics can be obtained.

Figure 17:
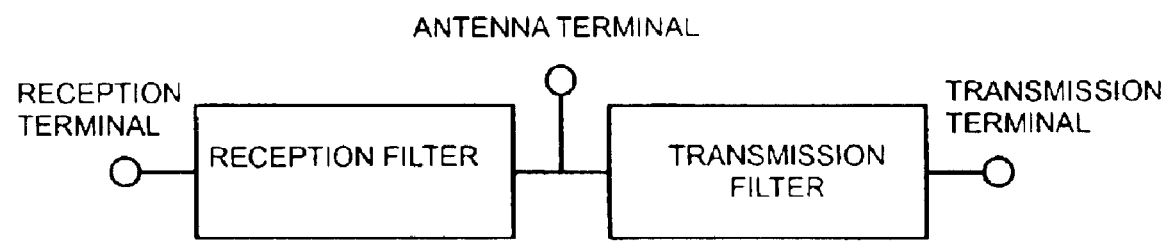
FIG. 17 is a block diagram showing the configuration of a duplexer according to an eighth embodiment.

FIG. 17 is a block diagram showing the configuration of a duplexer according to an eighth embodiment. Herein, a transmission filter and a reception filter, each having the same configuration as the filter shown in FIGS. 16A to 16D, are used. The pass band of the transmission filter and the reception filter is designed according to each band. Further, when the filters are connected to an antenna terminal, which serves as a transmission/reception terminal, a phase is adjusted so as to prevent a transmission signal from entering the reception filter and to prevent a reception signal from entering the transmission filter.

Figure 18:
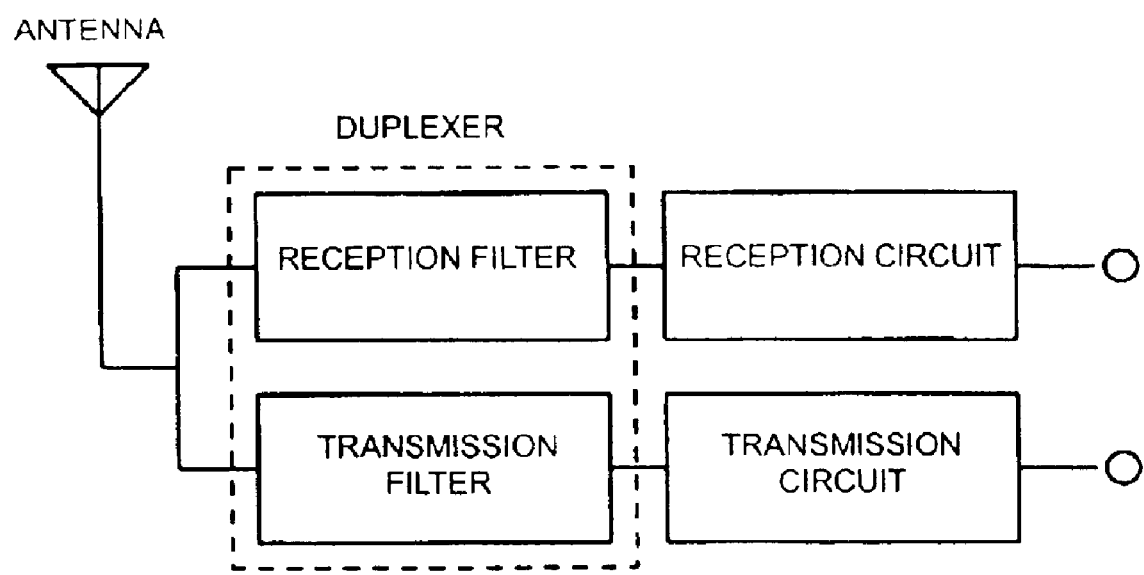
FIG. 18 is a block diagram showing the configuration of a communication apparatus according to a ninth embodiment.
Figure 19:
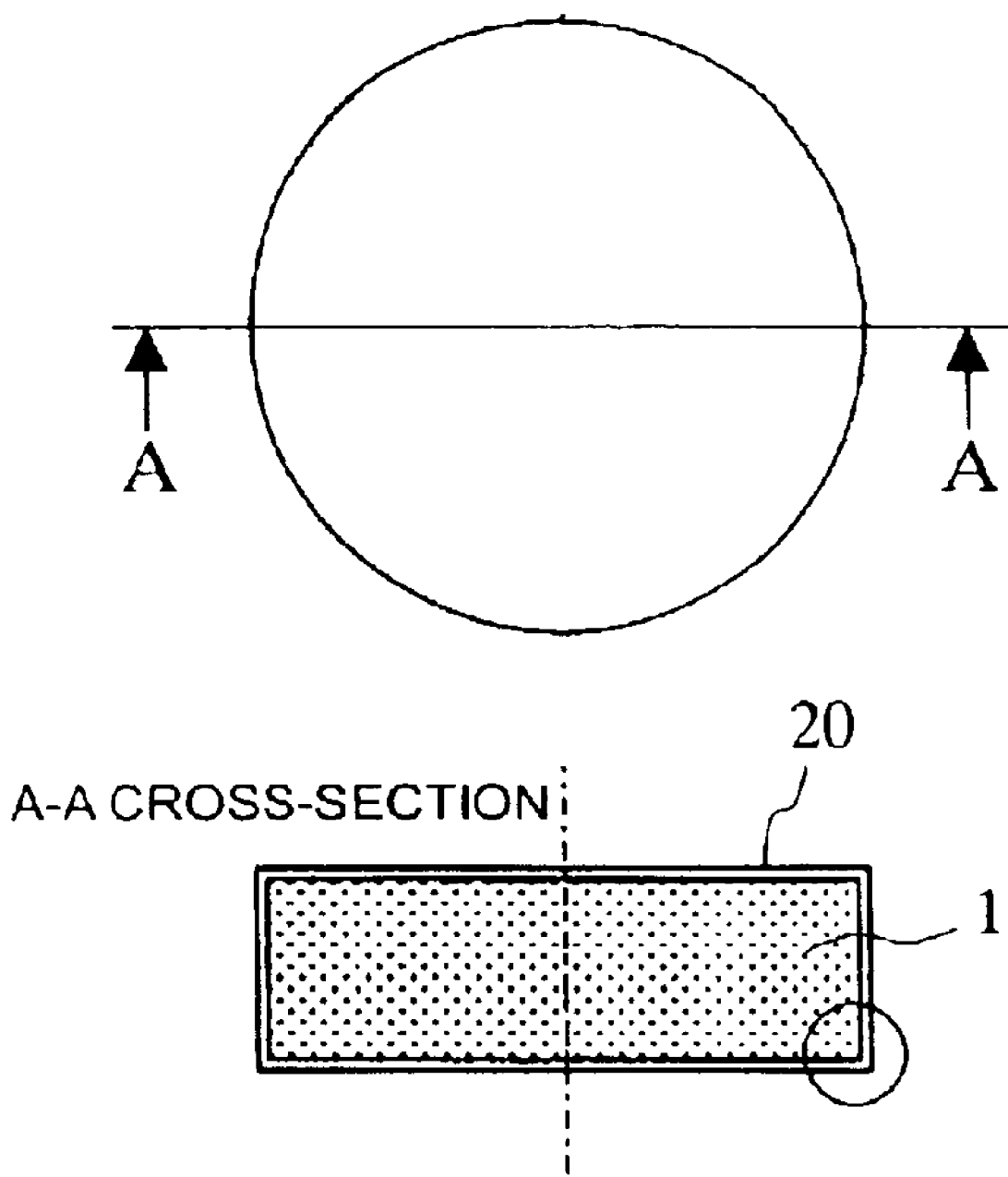
FIG. 19 shows the configuration of a known resonator of a short-circuit circular TM010 mode.
Figure 21:
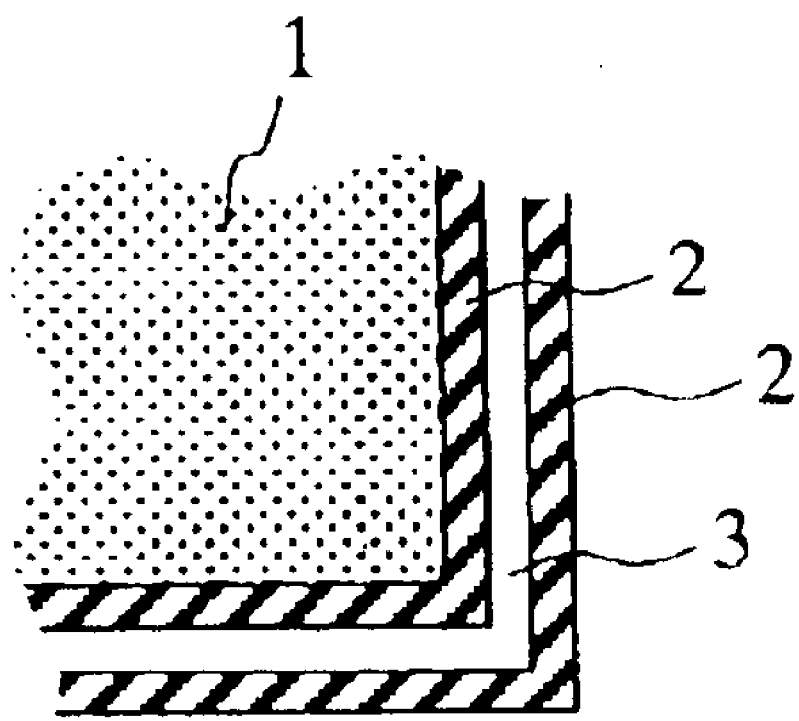
FIG. 21 is a partial cross-sectional view showing the configuration of a known thin-film multilayered electrode.

FIG. 18 is a block diagram showing the configuration of a communication apparatus according to a ninth embodiment. Herein, the duplexer having the configuration shown in FIG. 17 is used. A transmission circuit and a reception circuit are provided on a circuit board, the transmission circuit is connected to a transmission-signal input terminal of the duplexer, the reception circuit is connected to a reception-signal output terminal of the duplexer, and the duplexer is mounted on the circuit board so that an antenna is connected to an antenna terminal.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A high-frequency circuit device comprising:

a substrate; and an electrode film formed on a surface of the substrate, the electrode film including a conductive film and a dielectric film, wherein the conductive film is provided around the substrate such that both ends thereof overlap each other along the same surface of the substrate when viewed in a cross-section of the substrate, and the dielectric film is inserted between both ends of the conductive film so as to mutually insulate both ends of the conductive film.

2. The high-frequency circuit device according to claim 1, wherein the electrode film is a thin-film multilayered electrode formed by alternately laminating the conductive film and the dielectric film, and includes two or more conductive films at a non-overlapped portion.

3. A high-frequency circuit device comprising:

a substrate; and an electrode film formed on a surface of the substrate, the electrode film including a conductive film and a dielectric film, wherein the conductive film is provided around the substrate such that both ends thereof overlap each other when viewed in a cross-section of the substrate, the dielectric film is inserted between both ends of the conductive film so as to mutually insulate both ends of the conductive film, and wherein the thickness of at least a part of the conductive film and the dielectric film is substantially the same as or smaller than a thickness of a skin of a conductor at a used frequency.

4. A high-frequency circuit device comprising:

a substrate; and an electrode film formed on a surface of the substrate, the electrode film including a conductive film and a dielectric film, wherein the conductive film is provided around the substrate such that both ends thereof overlap each other when viewed in a cross-section of the substrate, the dielectric film is inserted between both ends of the conductive film so as to mutually insulate both ends of the conductive film, and wherein at least a part of the conductive film and the dielectric film is multi-lined and a width of each line is substantially the same as or smaller than a thickness of a skin of a conductor at a used frequency.

5. A resonator comprising:

a substrate, the substrate having a substantially hollow cylindrical shape; and an electrode film is provided on each of an outer surface and an inner surface of the substrate, the electrode film including a conductive film and a dielectric film, wherein the conductive film is provided around the substrate such that both ends thereof overlap each other when viewed in a cross-section of the substrate, and the dielectric film is inserted between both ends of the conductive film so as to mutually insulate both ends of the conductive film.

6. A filter comprising the resonator according to claim 5 and a signal input/output unit which is coupled to the resonator.

7. A duplexer comprising the filter according to claim 6, wherein the filter is used as at least one of a transmission filter and a reception filter.

8. A high-frequency circuit apparatus comprising the filter according to claim 6.

9. A waveguide comprising:

a substrate, the substrate being rod-shaped; and an electrode film provided on an outer surface of the substrate, the electrode film including a conductive film and a dielectric film, wherein the conductive film is provided around the substrate such that both ends thereof overlap each other when viewed in a cross-section of the substrate, and the dielectric film is inserted between both ends of the conductive film so as to mutually insulate both ends of the conductive film.

10. A resonator serving as a high-frequency circuit device comprising:

a substrate; and an electrode film formed on a surface of the substrate, the electrode film including a conductive film and a dielectric film, wherein a current in the conductive film surrounding the substrate flows in a surrounding direction of the substrate in a cross-section of the substrate and neither a node nor antinode of an electromagnetic field exists in a direction orthogonal to the cross-section;

both ends of a current path of the conductive film are close to each other, with the dielectric film therebetween, so that a region near both ends of the conductive film functions as a capacitance portion;

few nodes or antinodes of a current distribution are generated in an area between both ends of the conductive film, except the capacitance portion, so that the area between both ends of the conductive film functions as an inductive portion; and a magnetic field which is substantially free of a node or an antinode is induced at the cross-section due to the current flowing through the inductive portion so that a substantially uniform magnetic field is distributed throughout the cross-section, and an electric field is distributed in a small space formed by both closely-placed ends of the conductive film.

* * * * *